(12) United States Patent
Otsubo

(10) Patent No.: US 8,130,443 B2
(45) Date of Patent: Mar. 6, 2012

(54) OPTICAL WAVEFORM RESHAPING DEVICE

(75) Inventor: Koji Otsubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 961 days.

(21) Appl. No.: 12/033,398

(22) Filed: Feb. 19, 2008

(65) Prior Publication Data

US 2008/0198444 A1 Aug. 21, 2008

(30) Foreign Application Priority Data

Feb. 20, 2007 (JP) .................................. 2007-39806

(51) Int. Cl.
*H01S 3/00* (2006.01)
(52) U.S. Cl. .......................... 359/344; 398/175; 398/180
(58) Field of Classification Search .................. 398/175, 398/180; 359/344
See application file for complete search history.

(56) References Cited

U.S. PATENT DOCUMENTS

| | | | |
|---|---|---|---|
| 6,124,966 A * | 9/2000 | Yokoyama | 359/339 |
| 6,603,599 B1 * | 8/2003 | Wang et al. | 359/344 |
| 7,274,010 B2 * | 9/2007 | Matsuda et al. | 250/214 LA |
| 7,375,879 B1 * | 5/2008 | Shen | 359/344 |
| 2004/0196543 A1 | 10/2004 | Akiyama | |
| 2006/0221438 A1 | 10/2006 | Akiyama | |
| 2009/0147352 A1 * | 6/2009 | Marsh | 359/344 |

FOREIGN PATENT DOCUMENTS

| | | |
|---|---|---|
| JP | 5-75212 A | 3/1993 |
| JP | 2000-36641 A | 2/2000 |
| JP | 2004-288759 A | 10/2004 |
| JP | 2006-286810 A | 10/2006 |

OTHER PUBLICATIONS

D. Wolfson et al.; "40-Gb/s All-Optical Wavelength Conversion, Regegeneration, and Demultiplexing in an SOA-Based All-Active Mach-Zehnder Interferometer"; IEEE Photon. Technol. Lett. 12, No. 3, pp. 332-334 (200).

Y. Ueno et al; "Penalty-Free Error-Free All-Optical Data Pulse Regeneration at 84 Gb/s by Using a Symmetric-Mach-Zehnder-Type Semiconductor Regenerator"; IEEE Photon. Technol. Lett. 13, No. 5, pp. 469-471 (2001).

T. Akiyama et al; "Regeneration of 40 Gb/s Signals with a Quantum-Dot Semiconductor Optical Amplifier"; Spring 2005.

Notification of Reasons for Refusal dated May 26, 2009, issued in corresponding Japanese Patent Application No. 2007-039806.

Notification of Reasons for Refusal dated Dec. 24, 2008, issued in corresponding Japanese Patent Application No. 2007-039806.

* cited by examiner

*Primary Examiner* — Mark Hellner

(74) *Attorney, Agent, or Firm* — Westerman, Hattori, Daniels & Adrian, LLP

(57) ABSTRACT

An optical waveform reshaping device, including a semiconductor optical waveguide which has an active layer, wherein: optical amplification regions and optical absorption regions are installed alternately along the semiconductor optical waveguide; one optical amplification region is set longer than the other optical amplification regions so that a desired amplification factor can be obtained when power of an input optical signal is at an ON level; a power level is maintained by the other optical amplification regions excluding the one optical amplification region and by the optical absorption regions when the power of the input optical signal is at the ON level; and when the power of the input optical signal is at an OFF level, the input optical signal is absorbed by the optical absorption regions so that a power level of an output optical signal will not be higher than the power level of the input optical signal.

13 Claims, 11 Drawing Sheets

<Input power=0 dBm>

<Input power=−10 dBm>

<Input power=0 dBm>

<Input power=-10 dBm>

MZ INTERFEROMETER SYSTEM

SMZ INTERFEROMETER SYSTEM

DELAY INTERFEROMETER SYSTEM

GAIN SATURATION SYSTEM

OPTICAL WAVEFORM RESHAPING DEVICE

CROSS-REFERENCE TO RELATED APPLICATION

This application is based upon and claims the benefit of priority from the prior Japanese Patent Application No. 2007-039806 filed on Feb. 20, 2007, the entire contents of which are incorporated herein by reference.

BACKGROUND

1. Field

The present invention relates to an optical waveform reshaping device.

2. Description of Related Art

Toward future implementation of large-capacity photonic networks, there is demand for a technique for reproducing waveforms degraded due to dispersion of optical fibers, noise from repeating amplifiers, and the like, directly in optical form and such techniques have been studied actively.

Such techniques are generally referred to as 2R (Reamplification and Reshaping), or as 3R (Reamplification, Reshaping, and Retiming) including retiming added thereto.

Regarding conventional waveform reshaping techniques by means of optical semiconductor devices, there has been proposed a technique which uses monolithic integration of a semiconductor optical amplifier (SOA) with an optical waveguide in conjunction with a Mach-Zehnder (MZ) interferometer (see FIG. 11A), symmetric Mach-Zehnder (SMZ) interferometer (see FIG. 11B), or delay interferometer (see FIG. 11C). A case is reported in which a signal in a range of 40 to 80 Gb/s has been reproduced using devices such as described above.

Regarding techniques using single devices, for example, as shown in FIG. 11D, a gain saturation technique has been proposed which suppresses level-1 (ON level) noise using gain saturation of SOA.

Besides, an SOA with a bulk active layer or quantum well active layer has low gain response speed, which restricts a bit rate significantly, and it has been suggested that level-0 (OFF level) and level-1 (ON level) noises in a 40-Gb/s signal can be compressed if saturable absorbers are integrated using quantum dots with high gain response speed in the active layer.

Furthermore, since a single amplifier stage and single saturable absorption portion stage do not provide sufficient nonlinearity, an optical nonlinear amplifier device has been proposed in which amplifiers and saturable absorption portions are arranged in multiple stages.

SUMMARY

According to one aspect of an embodiment, there is an optical waveform reshaping device, including a semiconductor optical waveguide which has an active layer, wherein: optical amplification regions and optical absorption regions are installed alternately along the semiconductor optical waveguide; one optical amplification region is set longer than the other optical amplification regions so that a desired amplification factor can be obtained when power of an input optical signal is at an ON level; a power level is maintained by the other optical amplification regions excluding the one optical amplification region and by the optical absorption regions when the power of the input optical signal is at the ON level; and when the power of the input optical signal is at an OFF level, the input optical signal is absorbed by the optical absorption regions so that a power level of an output optical signal will not be higher than the power level of the input optical signal.

DESCRIPTION OF THE PREFERRED EMBODIMENTS

Figure 1:
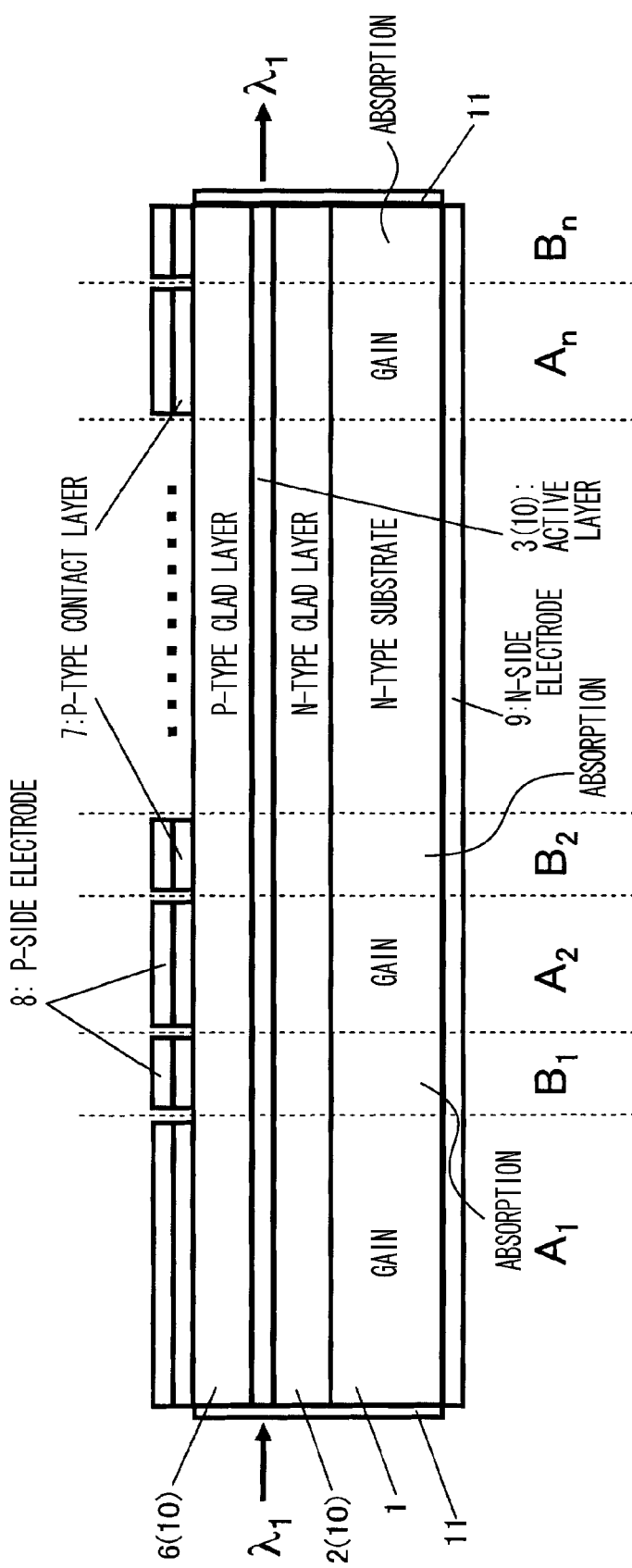
FIG. 1 is a sectional view taken along A-A' line in FIG. 2, the sectional view illustrating an optical waveform reshaping device according to an embodiment of the present invention.

As shown in FIG. 1, an optical waveform reshaping device according to this embodiment includes a semiconductor optical waveguide 10 which has an active layer 3, and optical amplification regions (gain regions) A1 to An and optical absorption regions B1 to Bn are installed alternately along a direction in which the semiconductor optical waveguide 10 extends (along a light guiding direction).

That is, as shown in FIG. 1, the optical waveform reshaping device is configured as a waveguide-type active optical semiconductor device in which a contact layer 7 and electrode 8 of one conductivity type (p-type, in this case) are formed separately so as to alternately form regions (optical amplification regions) A1 to An which inject current into the active layer 3 at a forward bias and regions (optical absorption regions) B1 to Bn which apply reverse bias voltage to the active layer 3 on the semiconductor optical waveguide 10 formed on a semiconductor substrate 1 of another conductivity type (n-type, in this case).

In this case, the optical amplification regions A1 to An and optical absorption regions B1 to Bn are formed in the semiconductor optical waveguide 10 and share the active layer 3 of the semiconductor optical waveguide 10. The active layer 3 is a quantum dot active layer. This makes it possible to reproduce a signal at a 40 Gb/s or higher bit rate.

Also, as shown in FIG. 1, an incident end face and emergent end face of the optical waveform reshaping device (and thus, an incident end face and emergent end face of the semiconductor optical waveguide 10) are covered with a non-reflective coating to form an anti-reflection film (non-reflecting structure) 11.

Figure 4:
FIG. 4 is a sectional view taken along B-B' line in FIG. 2 and showing a configuration of the optical waveform reshaping device according to an embodiment of the present invention.

Furthermore, as shown in FIG. 4, the semiconductor optical waveguide 10 is configured as a tilted waveguide which is tilted with respect to the emergent end face to prevent reflection. That is, the active layer 3 of the semiconductor optical waveguide 10 is formed obliquely so as to tilt with respect to the emergent end face.

In particular, according to this embodiment, as shown in FIG. 1, the region at the extreme incident end of the semiconductor optical waveguide 10 is the optical amplification region A1 and the region at the extreme emergent end is the optical absorption region Bn. That is, the semiconductor optical waveguide 10 has a structure which begins with an optical amplification region and ends with an optical absorption region along the light guiding direction of the semiconductor optical waveguide 10.

Also, according to this embodiment, as shown in FIG. 1, the optical amplification region A1 at the extreme incident end (the optical amplification region immediately after light incidence) is set longer than the other optical amplification regions A2 to An so that a desired amplification factor can be obtained when power of an input optical signal is at an ON level (level 1).

In this case, the length of the optical amplification region A1 at the extreme incident end (the optical amplification region immediately after light incidence) is set such as to allow an input signal light at the ON level to be amplified to such a power level that will cause gain saturation. In this way, the length of the optical amplification region A1 at the extreme incident end (the optical amplification region immediately after light incidence) is increased, causing gain saturation in the optical amplification region A1 and thereby suppressing level-1 noise (ON-level noise) to improve an S/N ratio.

When the input optical signal is at the ON level, the power level increased by the optical amplification region A1 at the extreme incident end is subsequently maintained at or around the increased level by the optical amplification regions A2 to An and optical absorption regions B1 to Bn.

Furthermore, according to this embodiment, when the power of the input optical signal is at an OFF level (level 0), the input optical signal is absorbed by the optical absorption regions B1 to Bn so that a power level of an output optical signal will not be higher than the power level of the input optical signal. This makes it possible to suppress level-0 noise. In particular, by placing an optical absorption region at the extreme emergent end, it is possible to suppress the level-0 noise while decreasing device length.

The optical waveform reshaping device of this embodiment will be described more concretely below.

Figure 2:
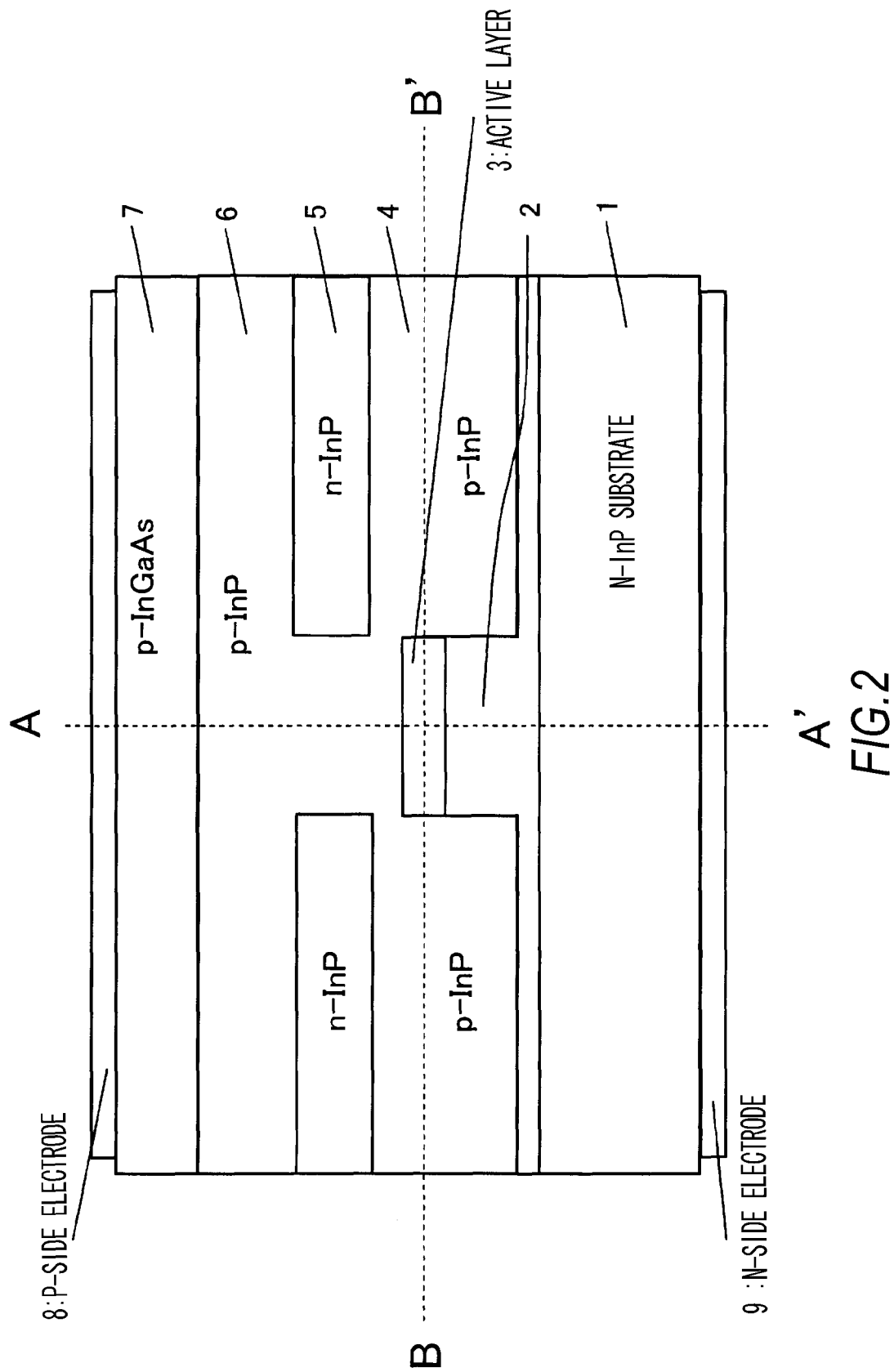
FIG. 2 is a sectional view showing a configuration of the optical waveform reshaping device according to an embodiment of the present invention.

As shown in FIG. 2, in the optical waveform reshaping device, a mesa structure including the active layer 3 is formed on an n-type InP substrate via an n-type InP clad layer 2, where due to current constriction and light confinement, the mesa structure is buried in a buried layer formed by a p-n junction of a p-type InP layer 4 and n-type InP layer 5.

Also, a p-type InP clad layer 6 is formed on the n-type InP buried layer 5 and a p-type InGaAs contact layer 7 is stacked on the p-type InP clad layer 6.

Furthermore, a p-side electrode (electrode metal) 8 is formed on the p-type InGaAs contact layer 7. On the other hand, an n-side electrode (electrode metal) 9 is formed on the rear face of the n-type InP substrate 1.

Figure 3:
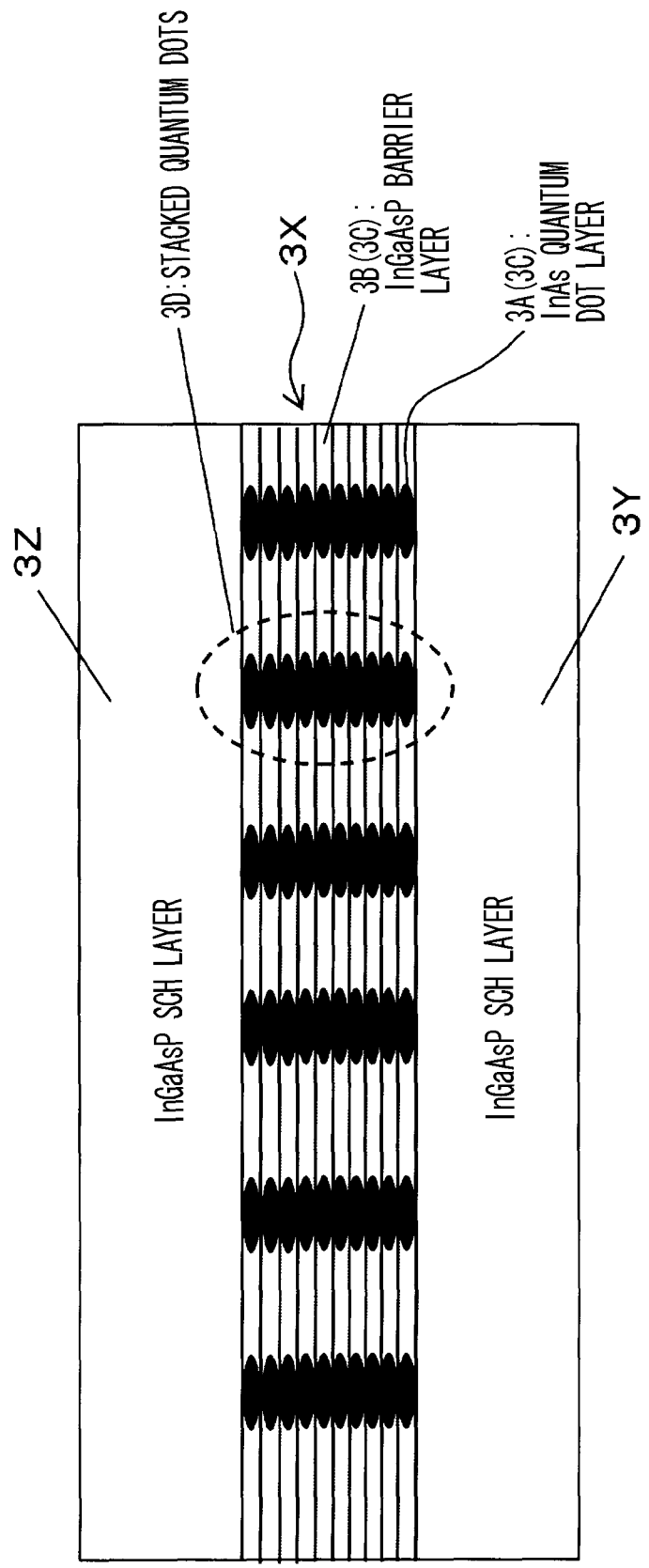
FIG. 3 is an enlarged sectional view showing the active layer taken along A-A' line in FIG. 2 and showing a configuration of the optical waveform reshaping device according to an embodiment of the present invention.

In this case, as shown in FIG. 3, which is an enlarged sectional view of a portion around the active layer 3, the active layer 3 has a structure in which stacked quantum dot layers 3X are sandwiched from above and below by InGaAsP-SCH layers 3Y and 3Z.

As shown in FIG. 3, the stacked quantum dot layers 3X have a structure in which multiple (22, in this case) quantum dot layers 3C each consisting of InAs quantum dots 3A buried in a InGaAsP barrier layer 3B are stacked in such a way as to connect the InAs quantum dots 3A among the quantum dot layers 3C. That is, as shown in FIG. 3, the stacked quantum dot layers 3X have a structure in which stacked quantum dots 3D consisting of multiple layers of quantum dots 3A are buried in the InGaAsP barrier layer 3B.

In particular, in the optical waveform reshaping device, as shown in FIG. 1, since the optical amplification regions A1 to An and optical absorption regions B1 to Bn are formed on the single device, the p-type InGaAs contact layer 7 and p-side electrode 8 are divided into multiple regions along the light guiding direction.

In this case, the p-type InGaAs contact layer 7 is divided into multiple regions along the light guiding direction by etching away part of the p-type InGaAs contact layer 7, and p-side electrodes 8 are formed separately on the resulting regions.

Thus, the optical waveform reshaping device according to this embodiment has the advantage of being able to improve the S/N ratio while keeping down input power (operating input power) which serves as a threshold and amplify a degraded signal (signal with decreased intensity, a disturbed waveform, or the like) while simultaneously reshaping the waveform by suppressing noise in the optical signal all by itself.

Figure 5A:
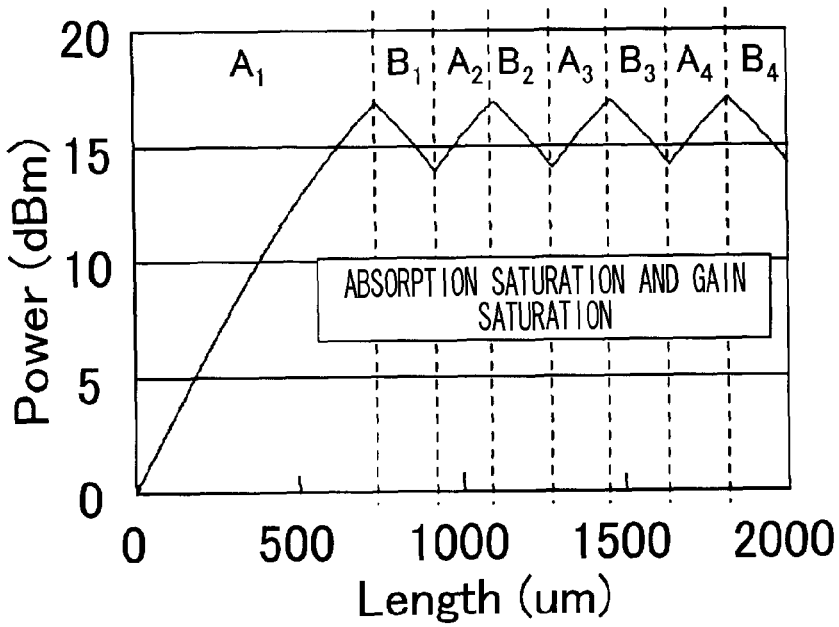
FIGS. 5A and 5B are diagrams showing changes in power in a light guiding direction of the optical waveform reshaping device according to embodiments of the present invention.
Figure 5B:
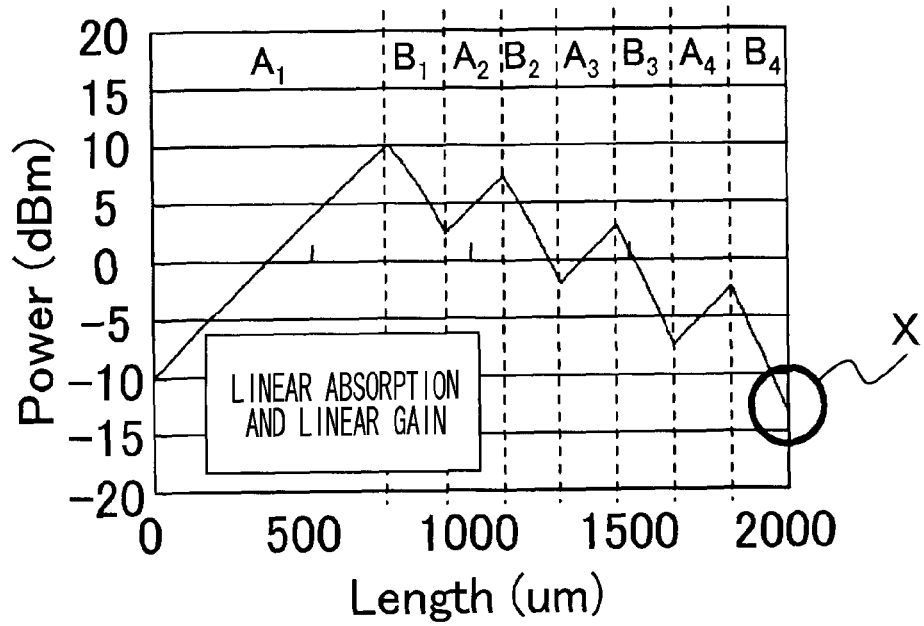

FIGS. 5A and 5B show changes in power along the light guiding direction in the optical waveform reshaping device configured as described above when the optical amplification region A1 at the extreme incident end is 740 μm long and the other optical amplification regions A2 to A4 and the optical absorption regions B1 to B3 are 180 μm long each, where the regions are arranged in such a way as to begin with the optical amplification region A1 at the extreme incident end, followed by three pairs of an optical absorption region and optical amplification region (three optical absorption regions B1 to B3 and three optical amplification regions A2 to A4, in all), and end with the optical absorption region B4.

In this case, when the input power is 0 dBm [referred to as level 1 (ON level)], gains in the optical amplification regions (gain regions) A2 to A4 and amounts of absorption in the optical absorption regions B1 to B4 are adjusted (see FIG. 5A) so that the power level increased by the optical amplification region A1 will be maintained by the subsequent optical amplification regions A2 to A4 and optical absorption regions B1 to B4. Specifically, the optical amplification factor of the optical amplification regions A2 to A4 is set equal to the optical absorption factor of the optical absorption regions B1 to B4.

According to this embodiment, the length of the optical amplification region A1 at the extreme incident end is set such as to allow an input signal light at the ON level (level 1) to be amplified to such a power level that will cause gain saturation, so as to increase the power level of the optical signal inputted in the optical amplification regions A2 to A4 and optical absorption regions B1 to B4 when the input optical signal is at the ON level (level 1), allowing the input optical signal to be amplified using saturation regions of gain characteristics in the optical amplification regions A2 to A4 and to be absorbed using saturation regions of absorption characteristics in the optical absorption regions B1 to B4. In this way, by causing gain saturation in the optical amplification regions A2 to A4 while causing absorption saturation in the optical absorption regions B1 to B4 to facilitate optical transmission, this embodiment suppresses level-1 noise (ON-level noise) and thereby improves the S/N ratio.

Under the above conditions, when the input power is changed to −10 dBm [referred to as level 0 (OFF level)], the amounts of absorption in the optical absorption regions B1 to B4 become larger than when the input power is at the ON level (level 1) because of the low power level. Consequently, the power level in the optical absorption regions B1 to B4 decreases greatly, but the optical amplification regions A2 to A4 do not provide sufficient gains because of their short lengths and consequently do not add much to the power level. Thus, the power level falls gradually. Consequently, as indicated by symbol X in FIG. 5B, the output power level falls to or below the input power level, making it possible to suppress level-0 noise.

In this way, this embodiment is configured such that the optical amplification factors of the optical amplification regions A2 to A4 other than the optical amplification region A1 at the extreme incident end will be equal to the optical absorption factors of the optical absorption regions B1 to B4 when the input power is at the ON level and that the optical absorption factors of the optical absorption regions B1 to B4 will be larger than the optical amplification factors of the optical amplification regions A2 to A4 other than the optical amplification region A1 at the extreme incident end when the input power is at the OFF level.

Also, as described above, when the optical signal (transmission signal) inputted in the semiconductor optical waveguide 10 is at the OFF level (level 0), the optical signal is amplified using linear regions (linear gains) of gain characteristics in the optical amplification regions A1 to A4 and absorbed using linear regions (linear absorption) of absorption characteristics in the optical absorption regions B1 to B4 because of the low power level, but when the optical signal is at the ON level (level 1), the optical signal is amplified using the saturation regions (gain saturation) of the gain characteristics in the optical amplification regions A1 to A4 and absorbed using the saturation regions (absorption saturation) of the absorption characteristics in the optical absorption regions B1 to B4 because of the high power level. Thus, the optical amplification regions A1 to A4 are saturable gain regions whose gain characteristics have saturation regions while the optical absorption regions B1 to B4 are saturable absorption regions whose absorption characteristics have saturation regions.

In particular, focusing on the power at the termination of the optical waveform reshaping device when the input power is at level 0 (−10 dBm), a structure in which the final stage is an optical absorption region is advantageous in that level-0 noise can be suppressed with a short device length.

Figure 6A:
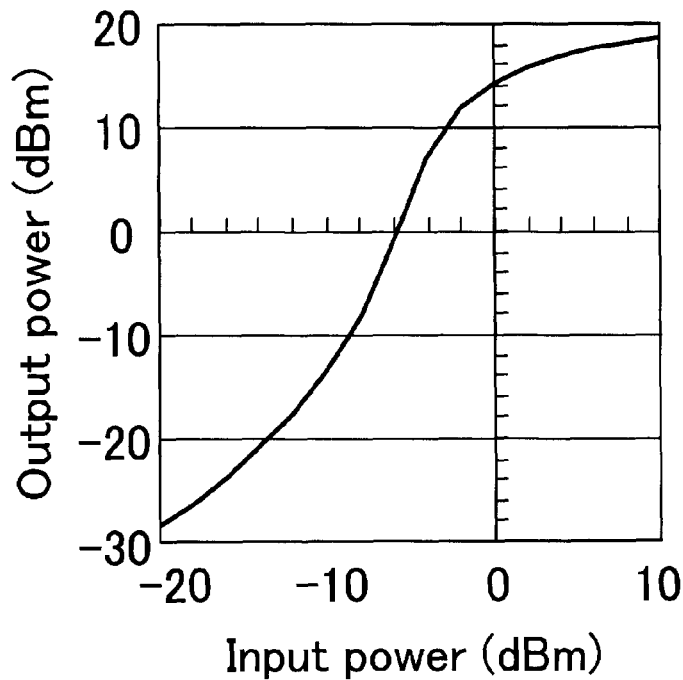
FIGS. 6A and 6B are diagrams showing input/output characteristics of the optical waveform reshaping device according to embodiments of the present invention.
Figure 6B:
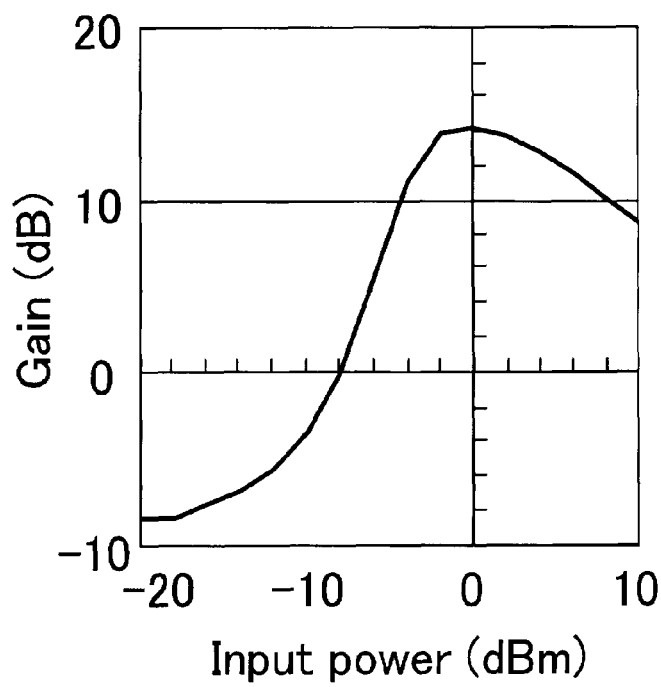

FIGS. 6A and 6B show calculated results of input/output characteristics (transfer functions) of the optical waveform reshaping device.

The optical waveform reshaping device can achieve stepwise input/output characteristics (input/output power characteristics and input power/gain characteristics) needed for 2R operation while keeping down the input power which serves as a threshold. Since 2R operation can be implemented using a single active device, it is possible to simplify configuration and reduce costs.

Figure 7:
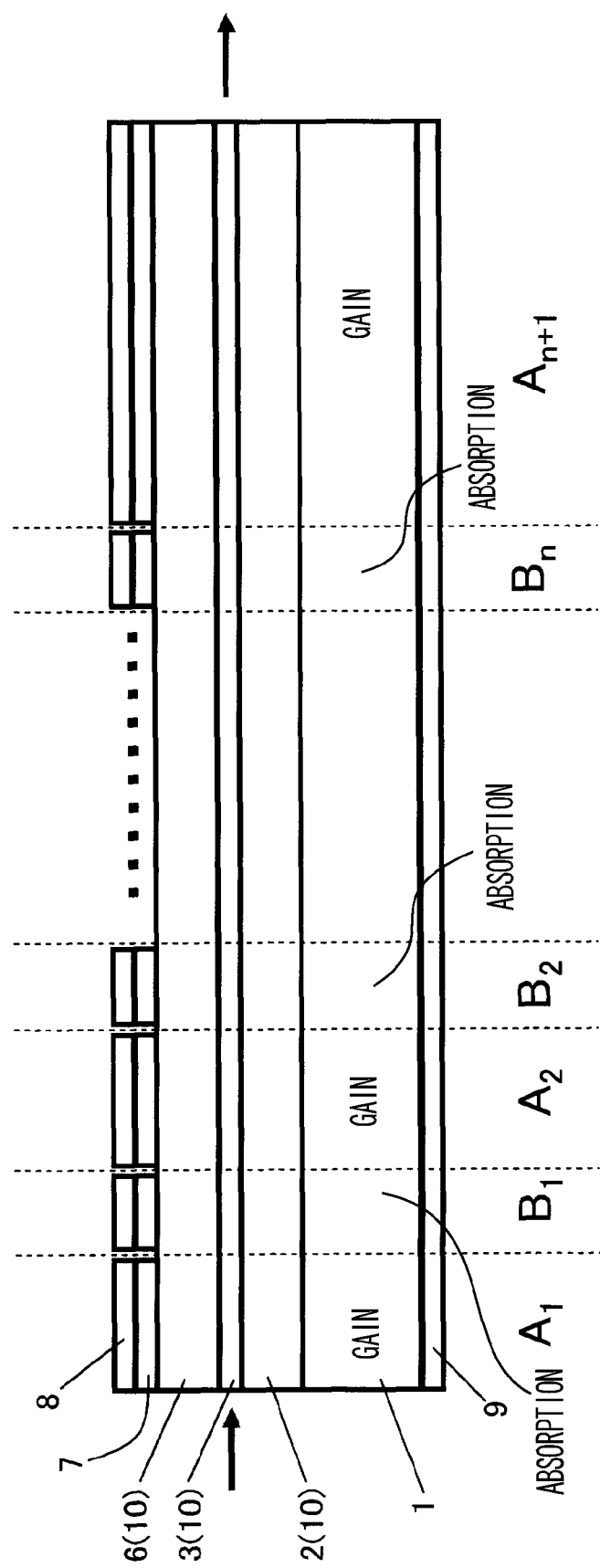
FIG. 7 is a sectional view illustrating an other optical waveform reshaping device.

FIG. 7 shows both the region at the extreme incident end (extreme input end) and region at the extreme emergent end (extreme output end) are optical amplification regions (gain regions) and the optical amplification region at the extreme emergent end is longer than the other optical amplification regions. That is, compared to the optical waveform reshaping device, the other optical waveform reshaping device has a structure in which the optical amplification region A1 at the extreme incident end is equal in length to the other optical amplification regions and an optical amplification region An+1 longer than the other optical amplification regions A1 to An is installed additionally at the extreme emergent end.

Incidentally, the lengths of the optical amplification regions and optical absorption regions are set equal to those of the above embodiment. Specifically, the optical amplification region A5 at the extreme emergent end is 740 μm long and the other optical amplification regions A1 to A4 and the optical absorption regions B1 to B4 are 180 μm long each. Four pairs of an optical amplification region and optical absorption region (four optical amplification regions A1 to A4 and four optical absorption regions B1 to B4, in all) are arranged starting from the incident emergent end and terminated by the optical amplification region A5 (see FIGS. 8A and 8B).

Figure 8A:
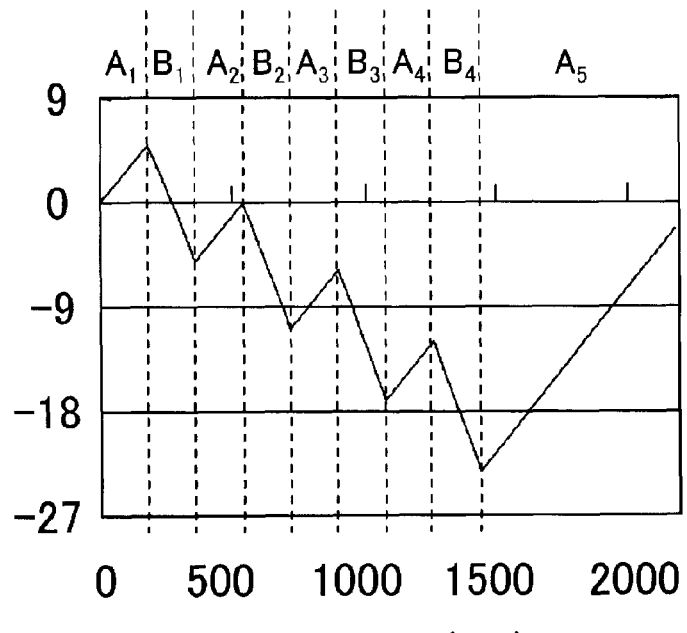
FIGS. 8A and 8B are diagrams showing changes in power in a light guiding direction of the other optical waveform reshaping device shown in FIG. 7.
Figure 8B:
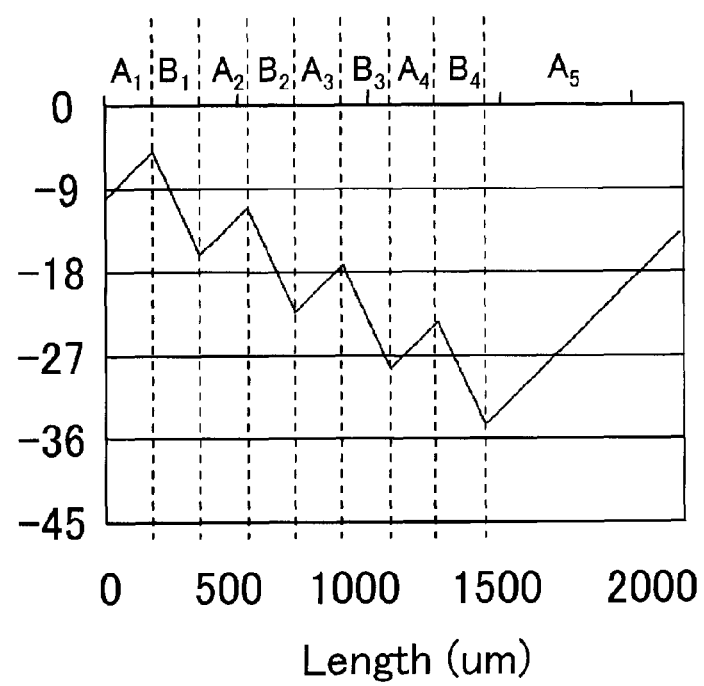

FIGS. 8A and 8B show changes in power along the light guiding direction in the other device configured as described above while FIGS. 9A and 9B show calculated results of input/output characteristics (input/output power characteristics and input power/gain characteristics) of the other device.

Figure 9A:
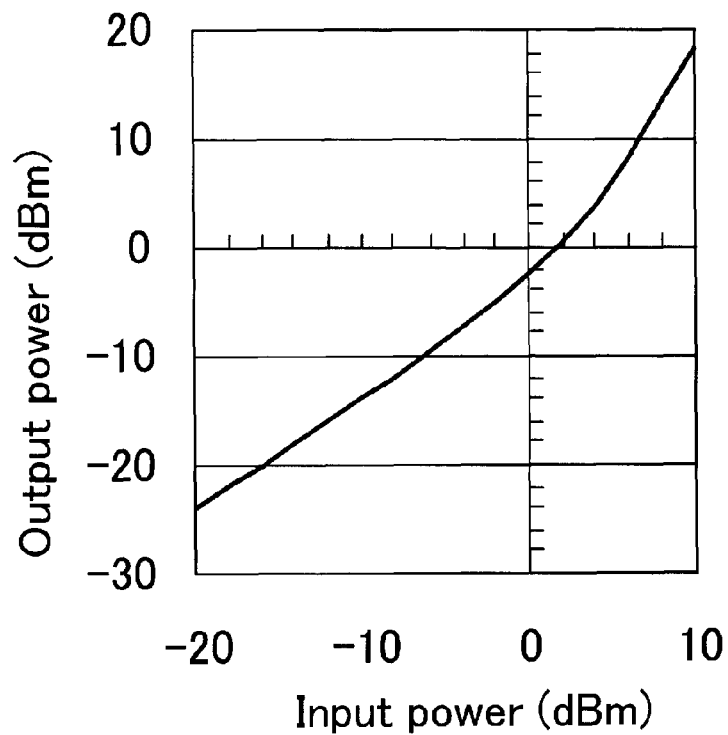
FIGS. 9A and 9B are diagrams showing input/output characteristics of the other optical waveform reshaping device shown in FIG. 7.

As shown in FIG. 9A, the input/output characteristics are similar between when the input optical signal is at level 1 (ON level) and when it is at level 0 (OFF level), meaning that difference in output power level (difference in output light intensity) is smaller than in the case of the optical waveform reshaping device, and thus, it can be seen that the other device is less effective in improving the S/N (signal-to-noise) ratio. Also, the final stage is an optical amplification region, amplified spontaneous emission (ASE) is superimposed, making is impossible to improve the S/N (signal-to-noise) ratio.

Figure 9B:
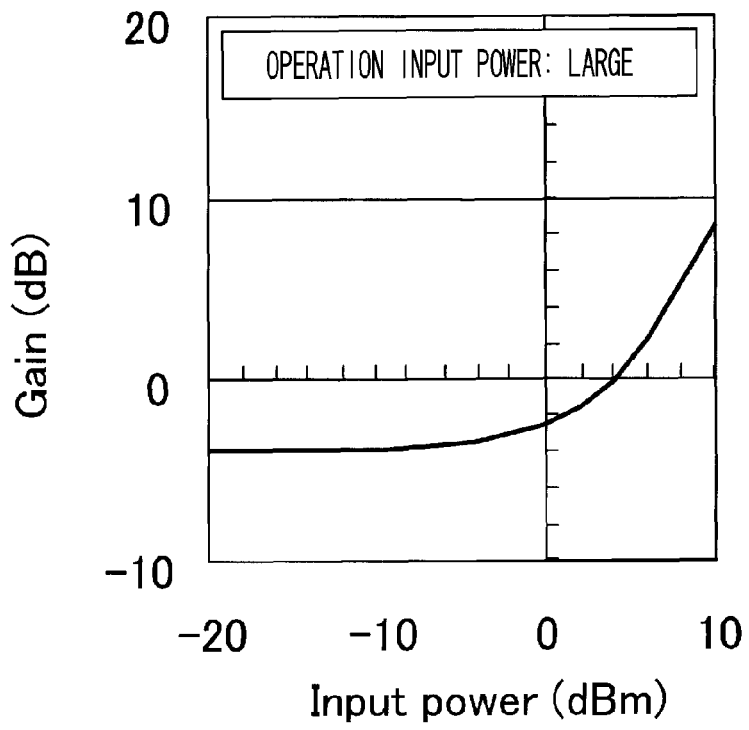
Figure 10:
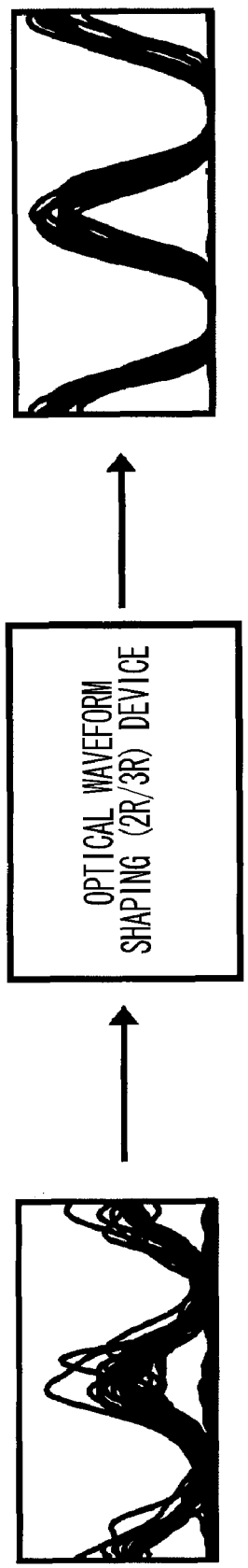
FIG. 10 is a diagram showing an optical waveform reshaping technique using an optical waveform reshaping device.
Figure 11A:
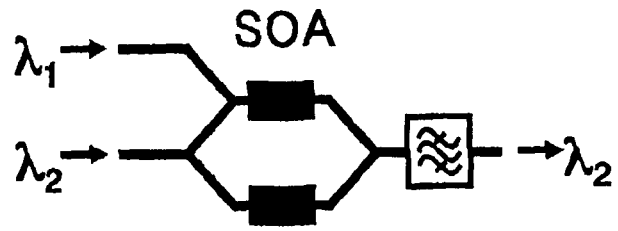
FIGS. 11A, 11B, 11C and 11D are diagrams illustrating conventional waveform reshaping techniques, which use optical waveform reshaping devices.
Figure 11B:
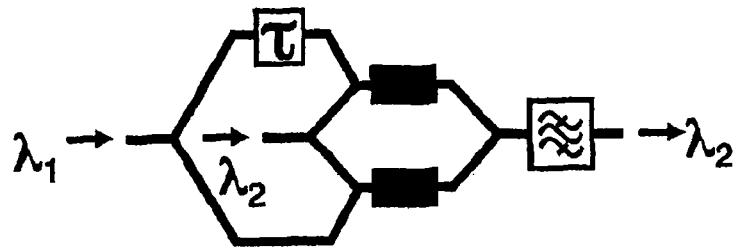
Figure 11C:
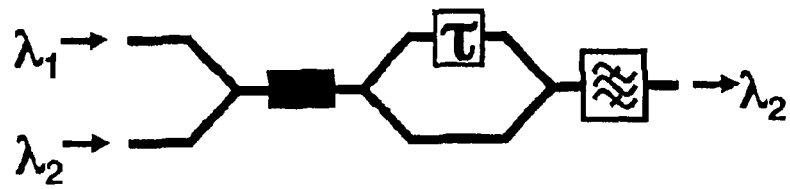
Figure 11D:

Also, as shown in FIGS. 9A and 9B, although stepwise characteristics are obtained as in the case of the optical waveform reshaping device, the input power (operating input power) which serves as a threshold is very high compared to the optical waveform reshaping device (see FIG. 6A) (i.e., the other device operates only when the input power level is very high), which makes it impossible to perform 2R or 3R operation for amplification or waveform reshaping of a signal.

In the above embodiment, the input signal light at the ON level is amplified by the optical amplification region A1 at the extreme incident end to such a power level that will cause gain saturation, and then the input signal light is amplified using the saturation regions (gain saturation) of the gain characteristics in the subsequent optical amplification regions A2 to A4 and absorbed using absorption regions (absorption saturation) of absorption characteristics in the optical absorption regions B1 to B4, but the present invention is not limited to this. For example, the input optical signal at the ON level may be amplified by the optical amplification region A1 at the extreme incident end so that the optical signal will be amplified using the saturation region of the gain characteristics in at least one of the other optical amplification regions. That is, the input signal light may be amplified to a power level short of gain saturation by the optical amplification region A1 at the extreme incident end [i.e., amplified to power level using the linear regions of the gain characteristics (linear gain)], and subsequently amplified using the saturation region of the gain characteristics in any of the other optical amplification regions. This makes it possible to suppress level-1 noise, and thereby improve the S/N ratio while keeping down the operating input power.

When an input optical signal is at the ON level, it is only necessary to provide a desired amplification factor using an optical amplification region longer than the other optical amplification regions and maintain the power level using the other optical amplification regions and optical absorption regions. There is no need to amplify the optical signal using gain saturation or absorb the optical signal using absorption saturation. For example, when an input optical signal is at the ON level, the input optical signal may be amplified using the linear regions (linear gain) of gain characteristics in optical amplification regions and absorbed using the linear regions (linear absorption) of absorption characteristics in optical absorption regions.

Furthermore, the optical amplification region set longer than the other optical amplification regions so that a desired amplification factor can be obtained when the input optical signal is at the ON level may be provided at any position rather than at the extreme incident end.

Also, in the above embodiment, the active layer is made uniform in material, composition, and structure, the optical amplification regions A2 to A4 and optical absorption regions B1 to B4 are all configured to be of the same length, and the amount of injected forward bias current and amount of applied reverse bias voltage are adjusted, thereby ensuring that the optical amplification factor of the optical amplification regions A2 to A4 will be equal to the optical absorption factor of the optical absorption regions B1 to B4 and that the power level will be kept constant, but the present invention is not limited to this. It is possible to define relationship between the optical amplification factor of the optical amplification regions A2 to A4 and the optical absorption factor of optical absorption regions B1 to B4 as desired by designing the material, composition, and structure of the active layer and lengths of the optical amplification regions and optical absorption regions and adjusting the amount of injected forward bias current and amount of applied reverse bias voltage. It is only necessary that at least the power level is maintained by the optical amplification regions A2 to A4 and optical absorption regions B1 to B4 when the input optical signal is at the ON level. For example, the optical amplification factor of the optical amplification regions A2 to A4 may be set larger than the optical absorption factor of optical absorption regions B1 to B4 when the input optical signal is at the ON level so that the power level will be increased gradually. Alternatively, the optical amplification factor of the optical amplification regions A2 to A4 may be set smaller than the optical absorption factor of optical absorption regions B1 to B4 so that the power level will be decreased gradually.

Also, in the above embodiment, quantum dots are used for the active layer, but the present invention is not limited to this. Effects similar to those of the above embodiment can be produced even if the active layer used is a bulk active layer or quantum well active layer. A bulk active layer or quantum well active layer may be used, for example, in the case of a low-bit-rate signal or in the case where regions with a low degree of gain saturation or regions with a linear gain are used.

Also, in the above embodiment, a buried-waveguide structure device which uses an InP-based material has been taken as an example, but the present invention is not limited to this. For example, the optical waveform reshaping device according to the present invention can also be implemented using a GaAs-based material.

Furthermore, the above embodiment uses a pn buried structure as the buried structure, but the present invention is not limited to this. For example, a semi-insulating buried structure may be used. Also, the above embodiment uses a buried-waveguide structure, but the present invention is not limited to this. For example, a ridge structure may be used as the waveguide structure.

Also, in the above embodiment, the contact layer is divided into multiple regions by etching and electrodes are formed on the divided contact layer to provide separate optical amplification regions and optical absorption regions, but the electrode separation method (separate electrode structure) is not limited to this. The electrodes may be separated by partially increasing resistance of the contact layer by proton injection (ion implantation).

The present invention is not limited to the embodiment described above, and various modifications may be made without departing from the spirit and scope of the present invention.

What is claimed is:

1. An optical waveform reshaping device, comprising:
   a semiconductor optical waveguide which has an active layer, said waveguide having optical amplification regions and optical absorption regions installed alternately along the semiconductor optical waveguide;
   one optical amplification region is set longer than the other optical amplification regions so that a desired amplification factor can be obtained when power of an input optical signal is at an ON level;
   a region at an extreme emergent end of the semiconductor optical waveguide is an optical absorption region;
   a power level is maintained by the other optical amplification regions excluding the one optical amplification region and by the optical absorption regions when the power of an input optical signal is at the ON level; and
   when the power of the input optical signal is at an OFF level, the input optical signal is absorbed by the optical absorption regions so that the power level of an output optical signal will not be higher than the power level of the input optical signal.

2. The optical waveform reshaping device according to claim 1, wherein the input optical signal at the ON level is amplified by the one amplification region so that the optical signal will be amplified using a saturation region of gain characteristics in at least one of the other optical amplification regions.

3. The optical waveform reshaping device according to claim 1, wherein optical amplification factors of the optical amplification regions other than the one optical amplification region are equal to optical absorption factors of the optical absorption regions when the power of the input optical signal is at the ON level and the optical absorption factors of the optical absorption regions are larger than the optical amplification factors of the optical amplification regions other than the one optical amplification region when the power of the input optical signal is at the OFF level.

4. The optical waveform reshaping device according to claim 1, wherein the one amplification region is provided at the extreme incident end.

5. The optical waveform reshaping device according to claim 4, wherein length of the one amplification region is set such as to allow an input signal light at the ON level to be amplified to such a power level that will cause gain saturation.

6. The optical waveform reshaping device according to claim 4, wherein the one amplification region is a saturable gain region whose gain characteristics have a saturation region.

7. The optical waveform reshaping device according to claim 6, wherein:
the optical amplification regions other than the one amplification region are saturable gain regions whose gain characteristics have saturation regions; and
the optical absorption regions are saturable absorption regions whose absorption characteristics have saturation regions.

8. The optical waveform reshaping device according to claim 1, wherein:
the optical amplification regions and optical absorption regions are formed by the semiconductor optical waveguide and share the active layer of the semiconductor optical waveguide;
a forward bias current is injected into the active layer in the optical amplification regions;
a reverse bias voltage is applied into the active layer in the optical absorption regions; and
the forward bias current is injected into the active layer in the optical amplification regions other than the one optical amplification region and the reverse bias voltage is applied into the active layer in the optical absorption regions so that optical amplification factors of the optical amplification regions other than the one optical amplification region will be equal to optical absorption factors of the optical absorption regions when the power of the input optical signal is at the ON level.

9. The optical waveform reshaping device according to claim 1, wherein the active layer is a quantum dot active layer.

10. The optical waveform reshaping device according to claim 1, wherein an incident end face and an emergent end face of the semiconductor optical waveguide are covered with a non-reflective coating.

11. The optical waveform reshaping device according to claim 10, wherein the semiconductor optical waveguide is configured as a tilted waveguide which is tilted with respect to the emergent end face.

12. An optical waveform reshaping device, comprising:
a semiconductor optical waveguide, said waveguide having optical amplification regions and optical absorption regions installed alternately along the semiconductor optical waveguide;
one optical amplification region is set longer than the other optical amplification regions;
a region at an extreme emergent end of the semiconductor optical waveguide is an optical absorption region.

13. The optical waveform reshaping device according to claim 12, wherein the one amplification region is provided at the extreme incident end.

* * * * *